(12) United States Patent
Chen et al.

(10) Patent No.: US 8,216,910 B2
(45) Date of Patent: Jul. 10, 2012

(54) GROUP III-V COMPOUND SEMICONDUCTOR BASED HETEROJUNCTION BIPOLAR TRANSISTORS WITH VARIOUS COLLECTOR PROFILES ON A COMMON WAFER

(75) Inventors: Mary Chen, Oak Park, CA (US); Marko Sokolich, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 449 days.

(21) Appl. No.: 12/478,628

(22) Filed: Jun. 4, 2009

(65) Prior Publication Data

US 2010/0047986 A1  Feb. 25, 2010

Related U.S. Application Data

(62) Division of application No. 11/202,001, filed on Aug. 10, 2005, now Pat. No. 7,576,409.

(60) Provisional application No. 60/603,480, filed on Aug. 20, 2004.

(51) Int. Cl.
*H01L 21/331* (2006.01)
*H01L 21/8222* (2006.01)

(52) U.S. Cl. ........ 438/312; 438/235; 438/309; 438/342; 438/343; 438/350

(58) Field of Classification Search .................. 438/235, 438/309, 312, 342, 343, 350
See application file for complete search history.

(56) References Cited

U.S. PATENT DOCUMENTS

| | | | |
|---|---|---|---|
| 5,223,449 A | 6/1993 | Morris et al. | 438/188 |
| 5,606,185 A | 2/1997 | Nguyen et al. | 257/197 |
| 5,753,545 A | 5/1998 | Liu et al. | 438/172 |
| 6,472,288 B2 | 10/2002 | Freeman et al. | 438/369 |
| 6,661,037 B2 | 12/2003 | Pan et al. | 257/197 |
| 6,936,871 B2 | 8/2005 | Hase | 257/198 |
| 2002/0066909 A1 | 6/2002 | Tanomura et al. | 257/197 |
| 2002/0153534 A1 | 10/2002 | Mochizuki et al. | 257/183 |
| 2004/0036082 A1 | 2/2004 | Bahl et al. | 257/197 |
| 2004/0175895 A1 | 9/2004 | Behammer | 438/319 |
| 2004/0188711 A1 | 9/2004 | Coolbaugh et al. | 257/197 |

FOREIGN PATENT DOCUMENTS

JP  05175438 A  7/1993

OTHER PUBLICATIONS

Bolognesi, C.R., et al., "Non-Blocking Collector InP/GaAs0.51Sb0.49/InP Double Heterojunction Bipolar Transistors with a Staggered Lineup Base-Collector Junction," *IEEE Electron Device Letters*, vol. 20, No. 4, pp. 155-157 (Apr. 1999).

Freeman, G., et al., "Device Scaling and Application Trends for Over 200GHz SiGe HBTs," *Digest of Papers*, Topical Meetings, pp. 6-9 (Apr. 9-11, 2003).

(Continued)

*Primary Examiner* — Bac Au
(74) *Attorney, Agent, or Firm* — Ladas & Parry

(57) ABSTRACT

A wafer comprising at least one high $F_t$ HBT and at least one high BVceo HBT having various collector profiles on a common III-V compound semiconductor based wafer. The N+ implant in the collector varies the collector profiles of individual HBTs on the wafer. The method for preparing the device comprises forming of HBT layers up to and including collector layer on non-silicon based substrate, performing ion implantation, annealing for implant activation, and forming remaining HBT layers.

20 Claims, 14 Drawing Sheets

OTHER PUBLICATIONS

Kroemer, H., "Heterostructure Bipolar Transistors and Integrated Circuits," *Proceedings of the IEEE*, vol. 70, No. 1, pp. 13-25 (Jan. 1982).

Nadella, R.K., et al., "MeV Energy Ion Implantation and its Device Applications in InP," *International Conference on InP and Related Materials*, pp. 353-356 (1993).

Pearton, S.J., et al., "Implant-Induced High-Resistivity Regions in InP and InGaAs," *J. Appl. Phys.*, vol. 66, No. 2, pp. 656-662 (Jul. 15, 1989).

Sato, H., et al., "High Current Density Emitter-Down InGaAlAs Heterojunction Bipolar Transistors," *IEEE Transactions on Electron Devices*, vol. 36, No. 11, p. 2601 (Nov. 1989).

Shibata, T., et al., "Stencil Mask Ion Implantation Technology," *IEEE Transactions on Semiconductor Manufacturing*, vol. 15, No. 2, pp. 183-188 (May 2002).

Sokolich, M., et al., "InP HBT Integrated Circuit Technology with Selectively Implanted Subcollector and Regrown Device Layers," *GaAsIc Symposium*, pp. 212-222 (2003).

Tseng, H.C., et al., "High-Performance, Graded-Base AlGaAs/InGaAs Collector-Up Heterojunction Bipolar Transitors Using a Novel Selective Area Regrowth Process," *IEEE Electron Device Letters*, vol. 20, No. 6, pp. 271-273 (Jun. 1999).

Yamahata, S., et al., "InP/InGaAs Collector-Up Heterojunction Bipolar Transistors Fabricated Using Fe-Ion-Implantation," *7th IPRM*, pp. 652-655 (1995).

GROUP III-V COMPOUND SEMICONDUCTOR BASED HETEROJUNCTION BIPOLAR TRANSISTORS WITH VARIOUS COLLECTOR PROFILES ON A COMMON WAFER

CROSS REFERENCE TO RELATED APPLICATIONS

This application is a division of U.S. patent application Ser. No. 11/202,001, filed on Aug. 10, 2005, which claims the benefit of U.S. Provisional Application No. 60/603,480, filed on Aug. 20, 2004, the disclosure of which is incorporated herein by reference.

STATEMENT REGARDING FEDERALLY SPONSORED RESEARCH OR DEVELOPMENT

The present invention was made with support from the United States Government under Grant number F33615-02-C-1286 awarded by the Air Force Laboratory at Wright Patterson AFB. The United States Government has certain rights in the invention.

FIELD OF THE INVENTION

This invention relates to a new design with III-V compound semiconductor based on Heterojunction Bipolar Transistors (HBTs) with various collector profiles, including those for high $F_t$ HBTs and for high breakdown voltage (BVceo) HBTs on a common wafer and to a method of producing the same.

BACKGROUND AND PRIOR ART

Although InP and GaAs based HBT Integrated Circuit (IC) technologies have demonstrated great potential in high-speed digital and mixed-signal applications because of superior speed and bandwidth properties over the SiGe based HBT technology, up to now InP and GaAs based HBTs with high $F_t$ and with high BVceo could not be built on a common wafer because they require different collector profiles. HBT layer structures with various collector profiles are not available on the same substrate.

SiGe based HBT technology of various collector concentrations available on same chip has been described in the prior art. See for example G. Freeman et al, "Device scaling and application trends for over 200 GHz SiGe HBTs", 2003 Topical Meetings on Silicon Monolithic Integrated Circuits in RF Systems, pp. 6-9, Digest of papers. The SiGe based HBT technology enables high $F_t$ to be traded for high BVceo on the same chip. However, IC designers up to now could not trade high $F_t$ for high BVceo or vise versa on same InP or GaAs wafer.

Ability to provide high $F_t$ HBTs and high BVceo HBTs on the same chip is particularly useful in smart Power Amplifiers (PAs) in millimeter wave image radar. Increased power provides longer distance of operation. Smart PAs with digital electronics to control the PAs can be realized by high speed signal processes for regular logic and high BVceo (breakdown voltage) for large swing at the output stage. However, presently, when high BVceo HBTs are used in logic circuits lower speed may occur as compensation due to inability to serve as high $F_t$ HBTs in logic circuits on the same chip.

Ability to provide high $F_t$ HBTs and high BVceo HBTs on a common chip substrate is also useful in the front-end stage of an analog to digital (A/D) converter. Having high $F_t$ HBTs and high BVceo HBTs on common chip substrate provides increased dynamic range and larger input to analog converter which is advantageous for higher signal/noise (S/N) ratio and resolution. However, A/D technologies of today cannot provide significantly higher peak-to-peak input signal than 1V with good linearity. Better dynamic range will certainly improve this technology.

Accordingly there is a need of fabricating and integrating high $F_t$ HBTs and high BVceo HBTs on the common non-silicon based wafer and chip.

SUMMARY

According to the present disclosure, Heterojunction Bipolar Transistors (HBTs) with various collector profiles, including those for high $F_t$ HBTs and for high breakdown voltage (BVceo) HBTs on a common wafer are disclosed.

According to a first aspect, a wafer is disclosed, comprising: a group III-V compound semiconductor based substrate; at least one high $F_t$ Heterojunction Bipolar Transistor (HBT) formed on said substrate; and at least one high breakdown voltage (BVceo) HBT formed on said substrate, wherein collector thickness of said at least one high $F_t$ HBT is less than collector thickness of said at least one high BVceo HBT.

According to a second aspect, an Integrated Circuit (IC) is disclosed, comprising: a group III-V compound semiconductor based substrate; at least one high $F_t$ Heterojunction Bipolar Transistor (HBT) formed on said substrate; and at least one high breakdown voltage (BVceo) HBT formed on said substrate, wherein collector thickness of said at least one high $F_t$ HBT is less than collector thickness of said at least one high BVceo HBT.

According to a third aspect, an Integrated Circuit (IC) is disclosed, comprising: a group III-V compound semiconductor based substrate; and at least one Heterojunction Bipolar Transistor (HBT) whose collector thickness is less than collector thickness of at least one other HBT.

According to a fourth aspect, a wafer is disclosed, comprising: a group III-V compound semiconductor based substrate; and at least one Heterojunction Bipolar Transistor (HBT) whose collector thickness is less than collector thickness of at least one other HBT.

According to a fifth aspect, an Integrated Circuit (IC), is disclosed, comprising: a group III-V compound semiconductor based substrate; and at least one Heterojunction Bipolar Transistor (HBT) whose collector thickness is greater than collector thickness of at least one other HBT.

According to a sixth aspect, a wafer is disclosed, comprising: a group III-V compound semiconductor based substrate; and at least one Heterojunction Bipolar Transistor (HBT) whose collector thickness is greater than collector thickness of at least one other HBT.

According to a seventh aspect, a wafer is disclosed, comprising: at least two Heterojunction Bipolar Transistors (HBTs) each comprising a group III-V compound semiconductor based substrate; a first sub-collector layer formed on said substrate; a collector layer formed on said sub-collector layer; an implant region within said collector layer, wherein said implant region varies in depth and shape as between said at least two HBTs; a base layer formed on said collector layer; an emitter layer formed on said base layer; an emitter cap layer formed on said emitter layer; an electrically conducting emitter contact formed on said emitter cap layer; an electrically conducting base contact formed on said base layer; and an electrically conducting collector contact formed on said sub-collector layer.

According to an eight aspect, a wafer is disclosed, comprising: at least two Heterojunction Bipolar Transistors (HBTs) each comprising a substrate containing InP; a sub-collector layer formed on said substrate, wherein said sub-collector layer contains InGaAs (N+); a collector layer formed on said sub-collector layer, wherein said collector layer contains InP (N−); an implant region within said collector layer, wherein said implant region varies in depth and shape as between said at least two HBTs; a base layer formed on said collector layer, wherein said base layer contains GaAsSb (P+) or InGaAs (P+); an emitter layer formed on said base layer, wherein said emitter layer contains InP (N) or InAlAs (N); an emitter cap layer formed on said emitter layer, wherein said emitter cap layer contains InGaAs (N+); an electrically conducting emitter contact formed on said emitter cap layer; an electrically conducting base contact formed on said base layer; and an electrically conducting collector contact formed on said sub-collector layer.

According to a ninth aspect, a wafer is disclosed, comprising: at least two Heterojunction Bipolar Transistors (HBTs) each comprising a substrate containing GaAs; a sub-collector layer formed on said substrate, wherein said sub-collector layer contains GaAs (N+); a collector layer formed on said sub-collector layer, wherein said collector layer contains GaAs (N−); an implant region within said collector layer, wherein said implant region varies in depth and shape between said at least two HBTs; a base layer formed on said collector layer, wherein said base layer contains GaAs (P+); an emitter layer formed on said base layer, wherein said emitter layer contains AlGaAs (N) or InGaP (N); an emitter cap layer formed on said emitter layer, wherein said emitter cap layer contains InGaAs (N+) or GaAs (N+); an electrically conducting emitter contact formed on said emitter cap layer; an electrically conducting base contact formed on said base layer; and an electrically conducting collector contact formed on said sub-collector layer.

According to a tenth aspect, a method of forming Heterojunction Bipolar Transistors (HBTs) on a wafer is disclosed, said method comprising: providing a group III-V compound semiconductor based substrate; forming of HBT layers up to and including a fully formed collector layer on said substrate; performing ion implantation on said fully formed collector layer for at least one HBT on said substrate so as to form a first region in said fully formed collector layer; annealing said substrate, so as said first region becomes an N+ first region; forming a base layer on said collector layer; forming emitter layer on said base layer; forming emitter cap layer on said emitter layer; providing electrically conducting emitter contact; providing electrically conducting base contacts; and providing electrically conducting collector contacts.

BRIEF DESCRIPTION OF THE FIGURES AND THE DRAWINGS

DETAILED DESCRIPTION

The present disclosure describes new designs with InP or GaAs based HBTs with various collector profiles including those for high $F_t$ HBTs and high BVceo HBTs on a common wafer. Specially designed epitaxial layer structures with selective area doping by ion implantation may integrate HBTs with various collector profiles, including those HBTs for high $F_t$ and HBTs for high BVceo on the same InP or GaAs wafer without backside processing.

Figure 1:
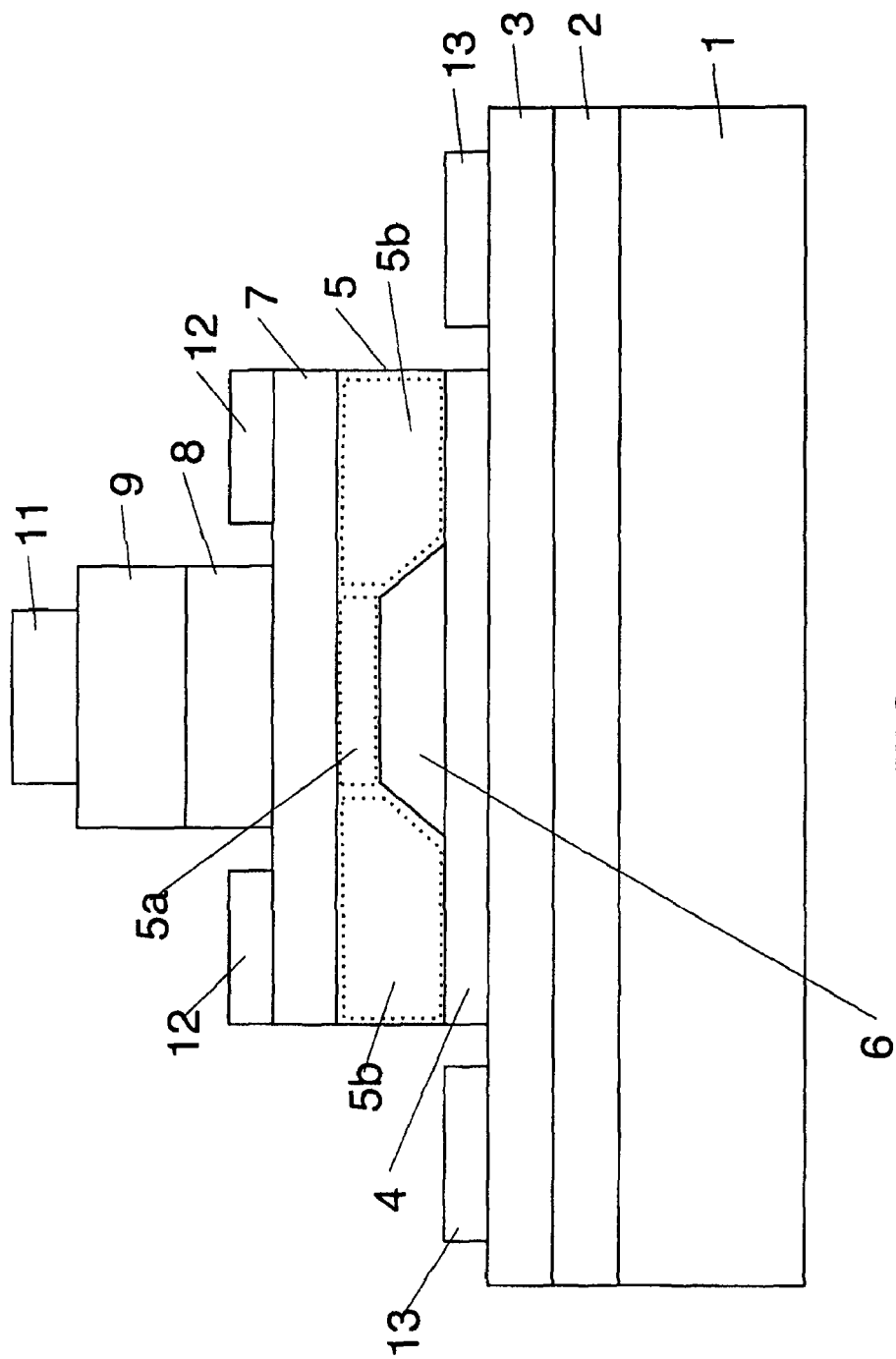
FIG. 1 depicts a side view of a HBT with an implant region in the collector layer based on a first exemplary embodiment of the invention.
Figure 2:
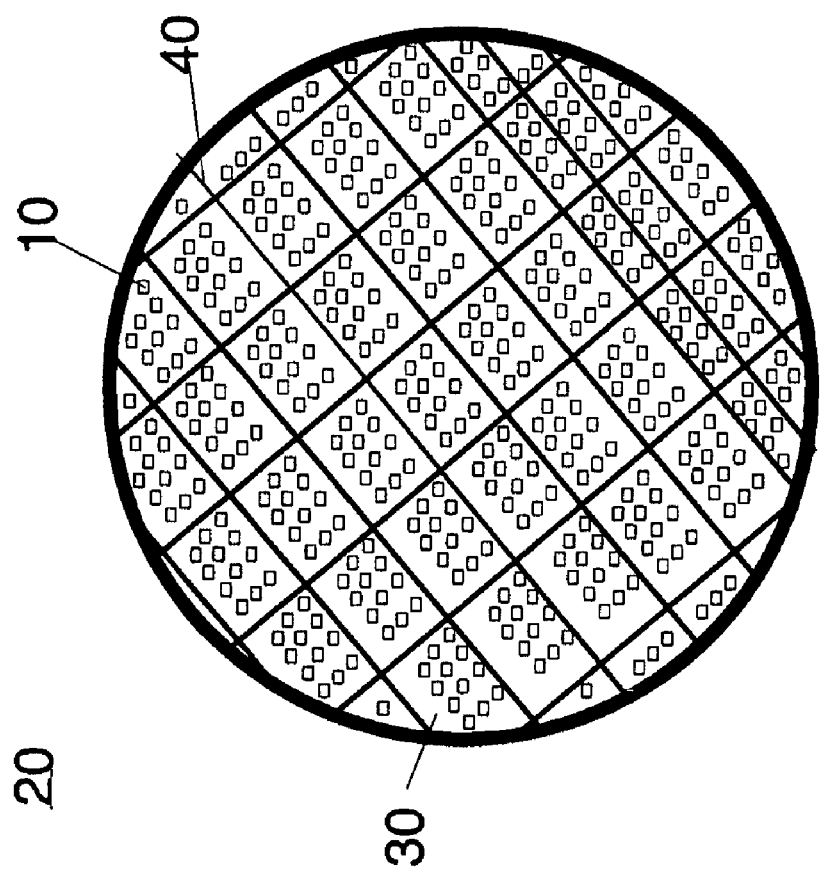
FIG. 2 depicts a wafer with HBTs on the wafer.

In one exemplary embodiment, FIG. 1 shows a cutaway side view of one of hundreds of thousands (for example) of HBTs 10 of the presently disclosed technology that may be grown as part of individual circuits 30 separated by streets 40 on a wafer 20 of FIG. 2. For clarity reasons the HBTs 10, individual circuits 30 and wafer 20, as depicted in FIGS. 1 and 2, are not to scale.

According to the presently disclosed technology, an individual HBT 10 on a single wafer 20, as shown in FIGS. 1 and 2, may be grown having either a high BVceo or a high $F_t$ by varying the ion implantation profile of region 6 in collector layer 5, as shown in FIG. 1.

Individual HBTs 10 may be grown on the substrate layer 1 of a wafer 20, as shown by FIGS. 1 and 3-19, wherein the substrate layer 1 may be a Semi-Insulating (S.I.) InP wafer. The thickness of the substrate layer 1 may be about 0.5 mm. For clarity and example purposes and not by way of limitation FIGS. 3-19 depict only the process of forming three HBTs with different collector profiles.

An optional etch stop layer (not shown) may be formed, for example, by epitaxial growth on top of the substrate layer 1. The optional etch stop layer may consist, for example, of N-type InGaAs (N+) material that is heavily doped with silicon. The thickness of the etch stop layer may, for example, be about 200 Å.

Figure 3:
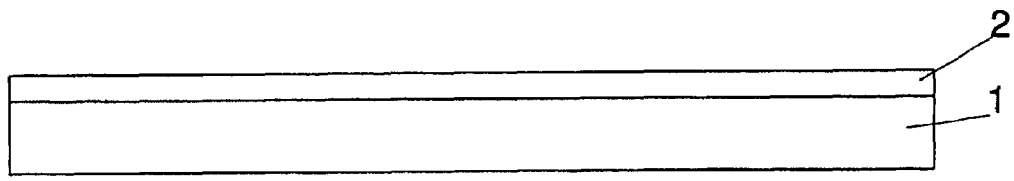
FIGS. 3-19 depict a process of forming HBTs based on a first exemplary embodiment of the invention.

An optional sub-collector layer 2 may formed, for example, by epitaxial growth on top of the substrate layer 1, as shown in FIG. 3 or on top of the etch stop layer (not shown). The optional sub-collector layer 2 may consist, for example, of N-type InP (N+) material that is heavily doped with silicon and provides for good thermal conduction. The thickness of the layer 2 may vary from about 1000 Å to about 5000 Å.

Figure 4:
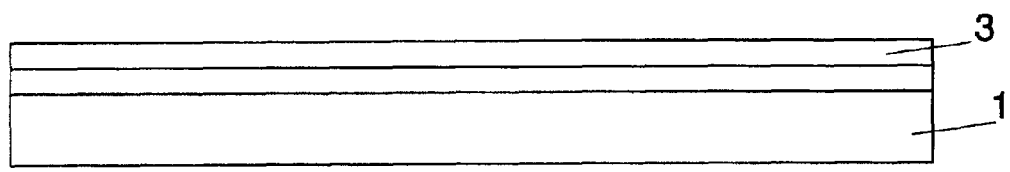

Another sub-collector layer 3 may be formed, for example, by epitaxial growth on top of the optional layer 2, as shown in FIG. 4, or on top of layer 1 (not shown). The sub-collector layer 3 may consist, for example, of N-type InGaAs (N+) material that is heavily doped with silicon and provides a good collector ohmic contact to collector contacts 13. The thickness of the layer 3 may vary from about 100 Å to about 5000 Å.

Figure 5:
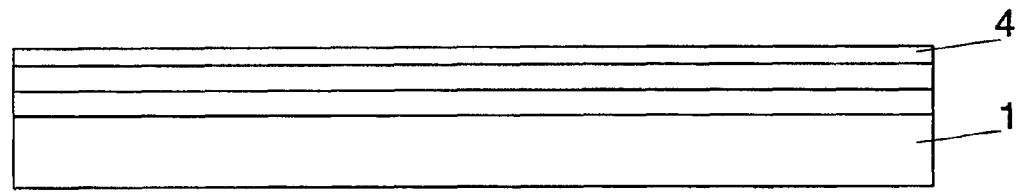

An additional optional sub-collector layer 4 may be formed, for example, by epitaxial growth on top of the layer 3, as shown in FIG. 5. The optional sub-collector layer 4 may consist, for example, of N-type InP (N+) material that is heavily doped with silicon and improves conduction band alignment between collector layer region 5b and sub-collector layer 3. The thickness of the layer 4 may vary from about 50 Å to about 500 Å.

Figure 6:
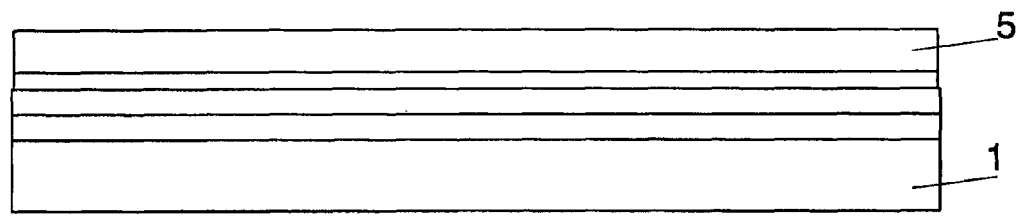

A collector layer 5 may be formed, for example, by epitaxial growth on top of the optional layer 4, as shown in FIG. 6, or on top of layer 3 (not shown). The collector layer 5 may consist, for example, of N-type InP (N−) material that is lightly doped with silicon. The doping and thickness of the collector layer 5 may be determined by the HBT in the wafer 20 with the highest BVceo requirement. Collector layer 5 may be formed, for example, by epitaxial growth uniformly across layer 4, as shown in FIG. 6, to a maximum thickness that is required to yield the HBT with the highest BVceo requirement.

Figure 7:
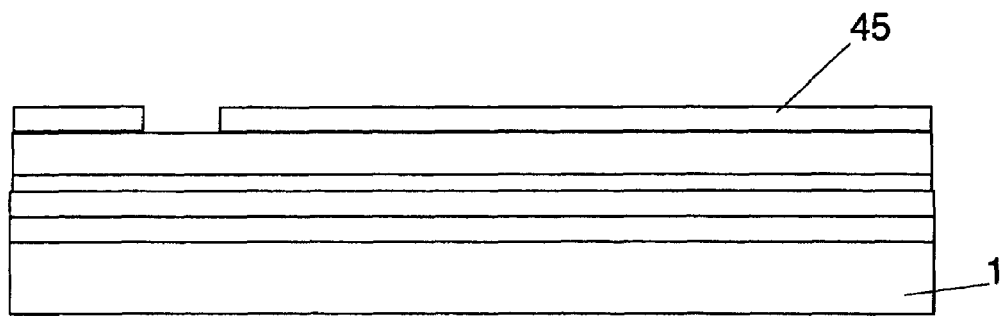
Figure 8:
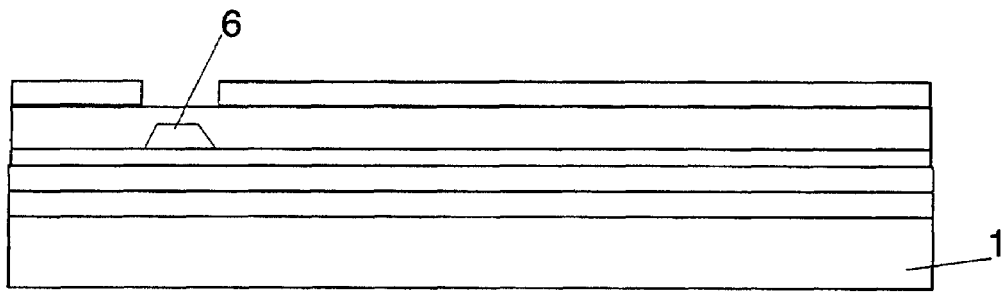
Figure 9:
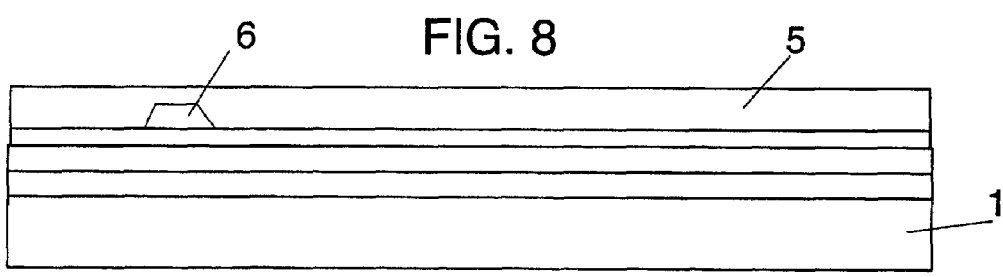
Figure 10:
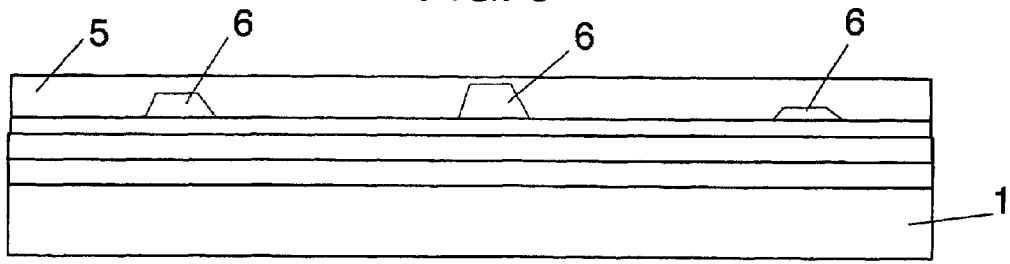

To produce HBTs 10 with either high BVceo or high $F_t$, as shown in FIG. 1, on a single wafer 20, the thickness of the lightly doped collector region 5a over a selected portion of the device may be chosen through ion implantation to create a heavily doped (N+) region 6. The ion implantation of region 6 in the individual HBTs 10 may be performed by: 1) applying and forming an implant mask 45 on top of the collector layer 5 so as to expose only the portion of the collector layer 5 for one or more of the HBTs 10 with the same collector profile requirements, as shown in FIG. 7; 2) performing ion implantation until region 6 is formed, as shown in FIG. 8; 3) removing implant mask 45, as shown in FIG. 9; 4) repeating steps 1-3 for the remaining HBTs 10 with different collector profile requirements to be ion implanted with regions 6, as shown in FIG. 10; 5) finally annealing the structure in FIG. 10 for implant activation of and damage removal within N+ regions 6. Since collector region is an important part for electron transport, various tailored collector profiles in region 5a may be obtained by implant. This capability provides flexibility to various device designs.

This disclosure is not limited to shape of implant regions 6 per individual HBTs as depicted in FIGS. 1 and 8-10. There could be single or multiple implants forming individual regions 6 per HBT depending on the requirement for the specific collector profile. The thickness and doping level of region 6 may be determined by the energy and dose of the ion implantation process.

The ion implantation of regions 6 may be performed by any ion implantation process, including by regular masked implant or by stencil mask ion implantation technology. See, for example, Takeshi Shibata et al, "Stencil mask ion implantation technology", IEEE Transactions on semiconductor manufacturing, Vol, 15, No. 2, May 2002, pp. 183-188.

Figure 11:
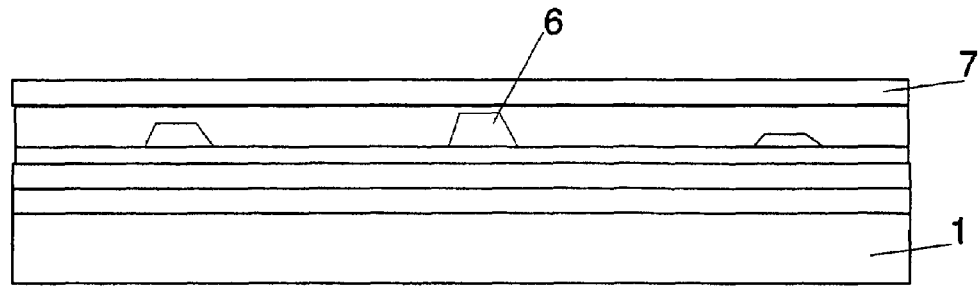

Upon completion of the ion implantation, a base layer 7 may be formed, for example, by epitaxial growth on top of the collector layer 5, as shown in FIG. 11. The base layer 7 may consist, for example, of P-type GaAsSb (P+) with carbon or beryllium doping or P-type InGaAs (P+) with carbon or beryllium doping materials. As known in the art (U.S. Pat. Nos. 5,606,185 and 5,753,545), if InGaAs material is used for the base layer 7, a quaternary graded layer (not shown) or chirped super-lattice graded layer (not shown) may be inserted between InP collector layer 5 and InGaAs base layer 7. A quaternary graded layer or chirped super-lattice graded layer may be useful to maintain lattice match and continuously adjust the conduction band edge from the InP collector 5 to the InGaAs base layer 7. The quaternary graded layer may consist, for example, of $Ga_{1-x}In_xAs_{1-y}P_y$ or $Al_xGa_yIn_{1-(x+y)}As$ materials, whereas the chirped super-lattice graded layer may consist, for example, of $Al_{0.48}In_{0.52}As$ and $Ga_{0.47}In_{0.53}As$ materials. The thickness of the layer 7 may, for example, be about 400 Å.

Figure 12:
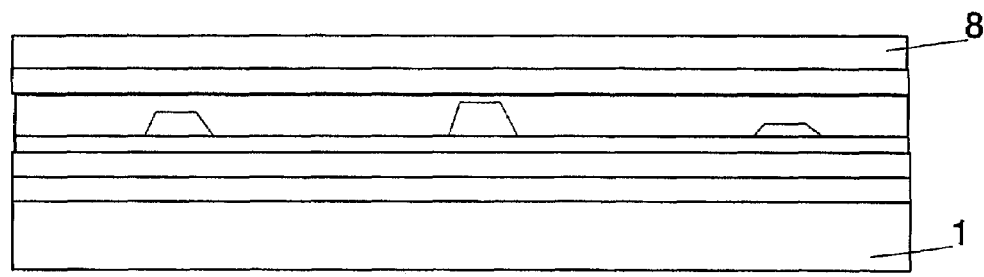

An emitter layer 8 may be formed, for example, by epitaxial growth on top of the base layer 7, as shown in FIG. 12. The emitter layer 8 may consist, for example, of N-type InP (N) material doped with silicon or N-type InAlAs (N) material doped with silicon. As known in the art, if the base layer 7 material is beryllium doped, a quaternary graded layer (not shown) or chirped super-lattice graded layer (not shown) may be inserted between the beryllium doped base layer 7 and the emitter layer 8. A quaternary graded layer or chirped super-lattice graded layer may be needed to prevent beryllium diffusion out of beryllium doped base layer 7. The quaternary graded layer may consist, for example, of $Ga_{1-x}In_xAs_{1-y}P_y$ or $Al_xGa_yIn_{1-(x+y)}As$ materials, whereas the chirped super-lattice graded layer may consist, for example, of $Al_{0.48}In_{0.52}As$ and $Ga_{0.47}In_{0.53}As$ materials. The thickness of the layer 8 may, for example, be about 1000 Å.

Figure 13:
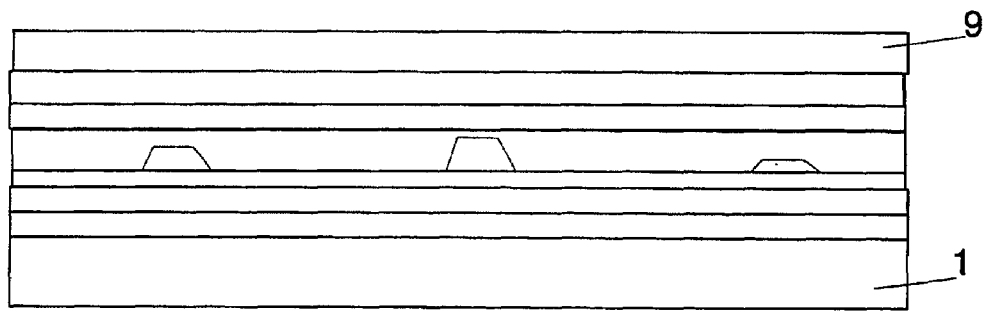

The emitter layer 8 may be followed by formation, for example, by epitaxial growth of emitter cap layer 9, as shown in FIG. 13. The emitter cap layer 9 may consist, for example, of N-type InGaAs (N+) material that is doped heavily with silicon. The thickness of the layer 9 may, for example, be about 1000 Å.

Figure 14:
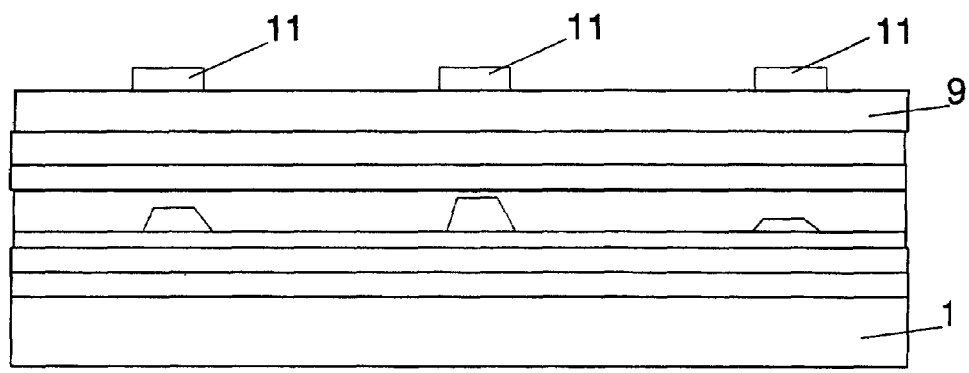
Figure 15:
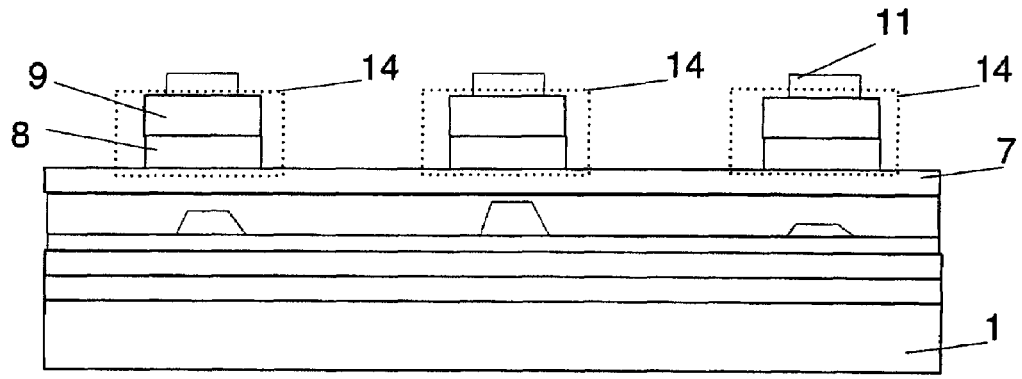
Figure 16:
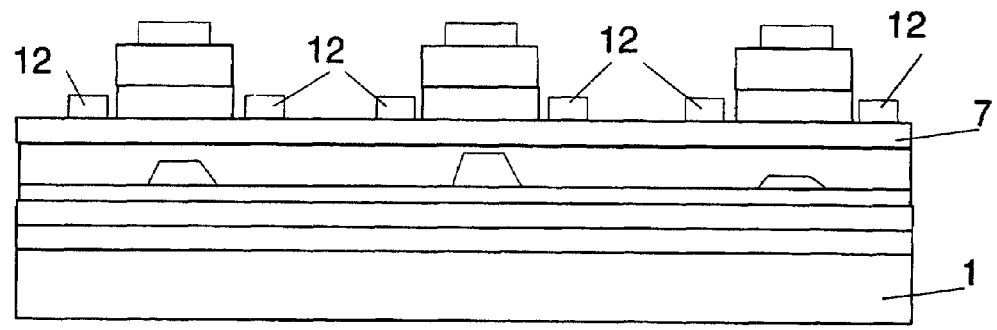
Figure 17:
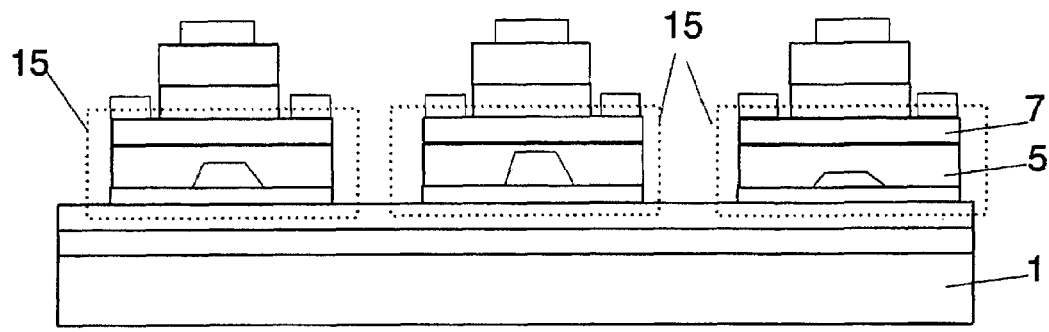
Figure 18:
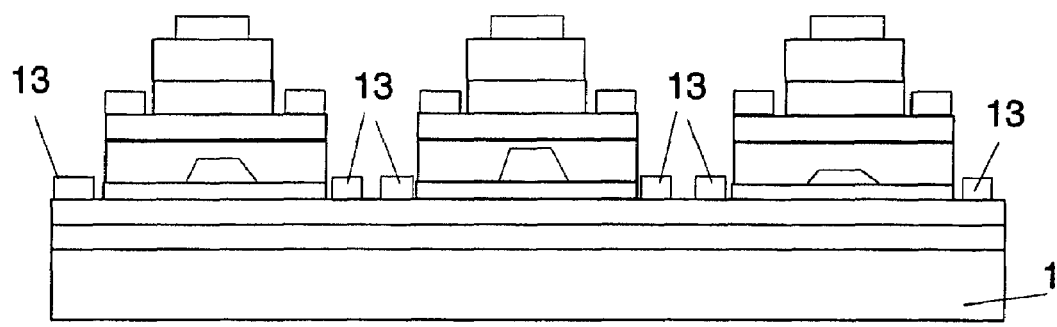
Figure 19:
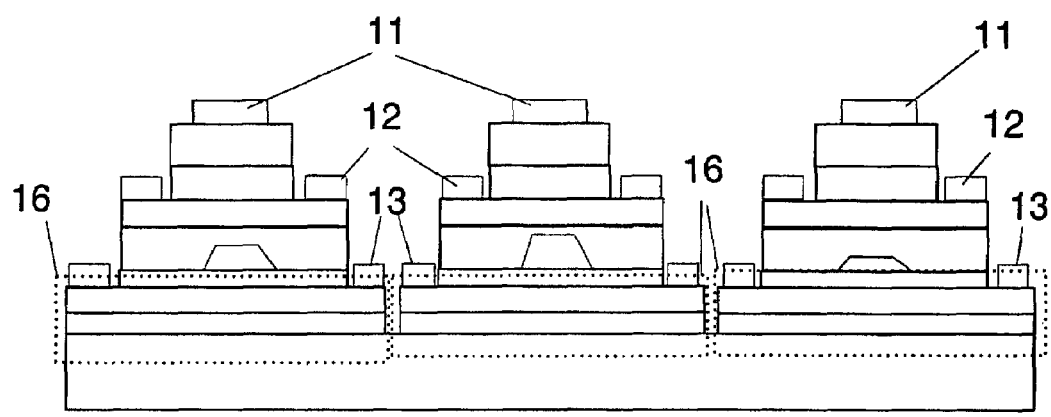

The process of HBT fabrication may further include well know steps in the art of: providing emitter contacts 11 through lithography and metal deposition as shown in FIG. 14; etching emitter mesas 14, as shown in FIG. 15; providing base contacts 12 through lithography and metal deposition, as shown in FIG. 16; etching base mesas 15, as shown in FIG. 17; providing collector contacts 13 through lithography and metal deposition, as shown in FIG. 18; and etching of collector/isolation mesas 16, as shown in FIG. 19.

The electrically conducting emitter contacts 11 may consist, for example, of Ti/Pt/Au. The electrically conducting base contacts 12 may consist, for example, of Ti/Pt/Au or Pt/Ti/Pt/Au. The electrically conducting collector contacts 13 may consist, for example, of Ti/Pt/Au, AuGe or AuGe/Ni/Au.

Figure 20:
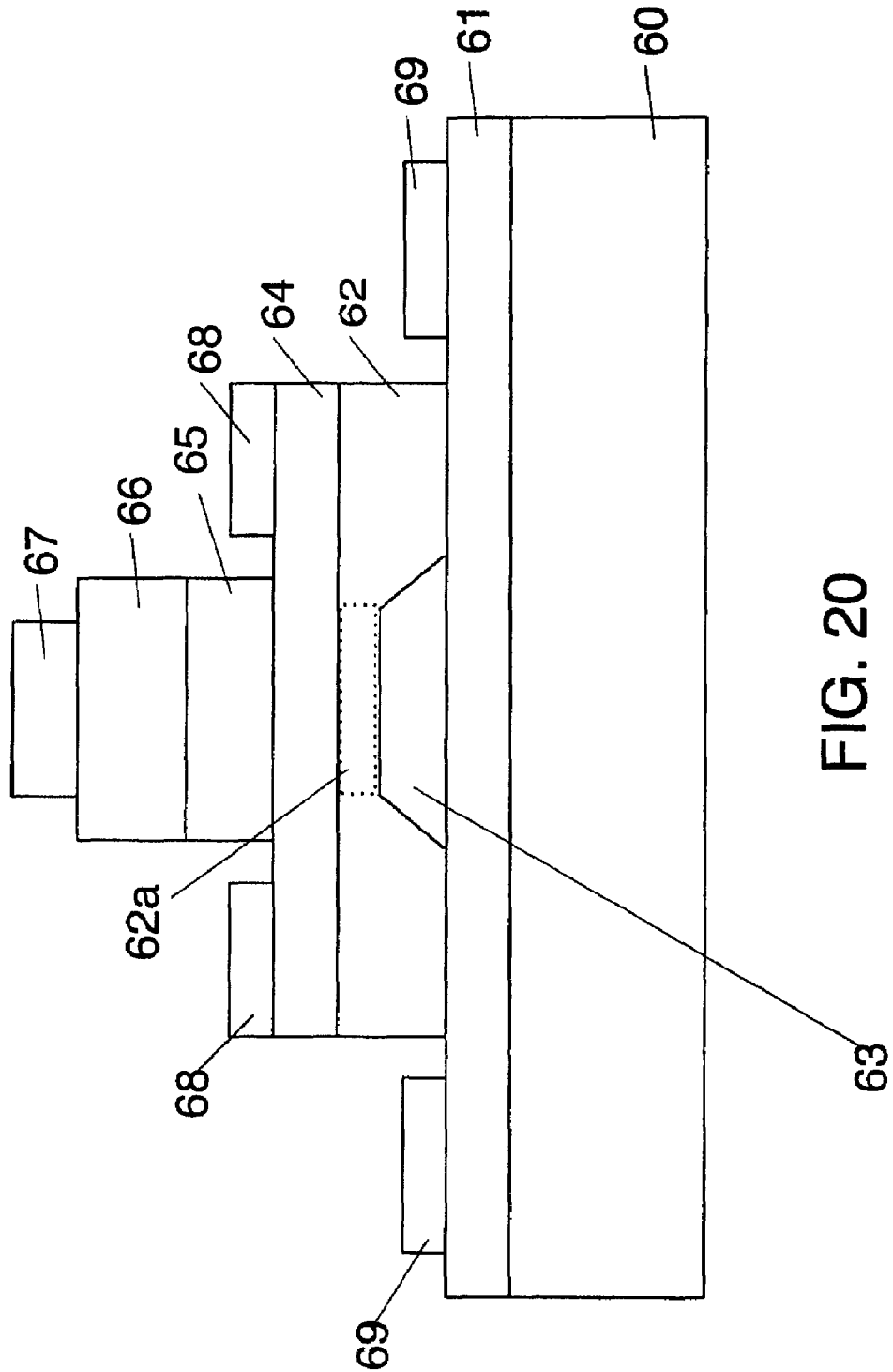
FIG. 20 depicts a side view of a HBT with an implant region in the collector layer based on a second exemplary embodiment of the invention.

In another exemplary embodiment, FIG. 20 shows a cutaway side view of one of hundreds of thousands (for example) of HBTs 10 of the presently disclosed technology that may be grown as part of individual circuits 30 separated by streets 40 on a wafer 20 of FIGS. 2 and 20.

According to the presently disclosed technology, an individual HBT 10 on a single wafer 20, as shown in FIGS. 20 and 2, may be grown having either a high BVceo or a high $F_t$ by varying ion implantation profile of region 63 in collector layer 62, as shown in FIG. 20.

Individual HBTs 10 may be grown on the substrate layer 60 of a wafer 20, as shown by FIGS. 20-35, wherein the substrate layer 60 may be a Semi-Insulating (S.I.) InP wafer. The thickness of the substrate layer 60 may be about 0.5 mm. For clarity and example purposes, and not by way of limitation, FIGS. 21-35 depict only the process of forming three HBTs with different collector profiles.

Figure 21:
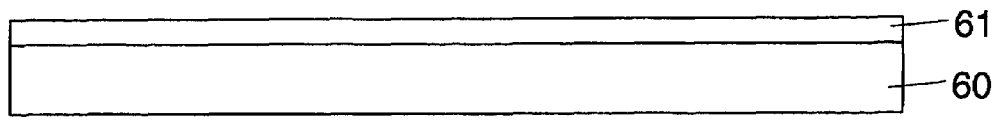
FIGS. 21-35 depict a process of forming HBTs based on a second exemplary embodiment of the invention.

A sub-collector layer 61 may be formed, for example, by epitaxial growth on top of the substrate layer 60, as shown in FIG. 21. The sub-collector layer 61 may consist, for example, of N-type InGaAs (N+) material that is doped heavily with silicon. The thickness of the InGaAs layer 61 may, for example, be about 3000 Å.

Figure 22:
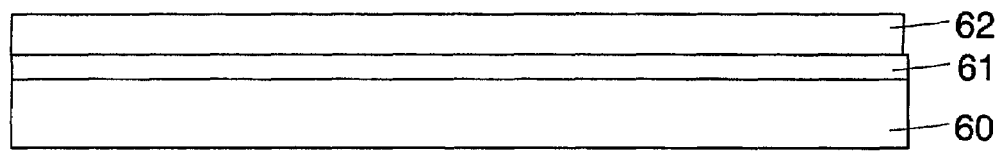

A collector layer 62 may be formed, for example, by epitaxial growth on top of the sub-collector layer 61, as shown in FIG. 22. The collector layer 62 may consist, for example, of N-type InP (N−) material that is doped lightly with silicon. The doping and thickness of the collector layer 62 may be determined by the HBT in the wafer 20 with the highest BVceo requirement. Collector layer 62 may be formed, for example, by epitaxial growth uniformly across layer 61, as shown in FIG. 22, to a maximum thickness that is required to yield the HBT with the highest BVceo requirement.

Figure 23:
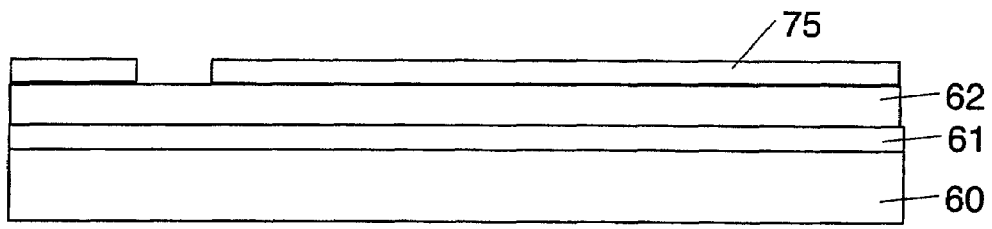
Figure 24:
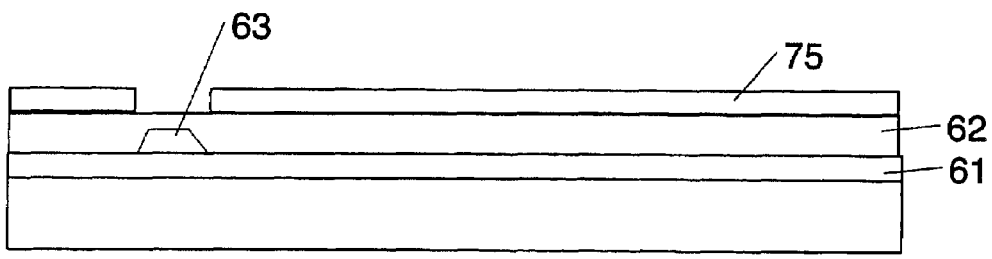
Figure 25:
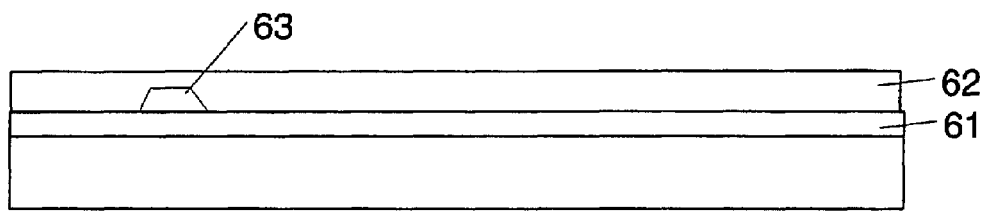
Figure 26:
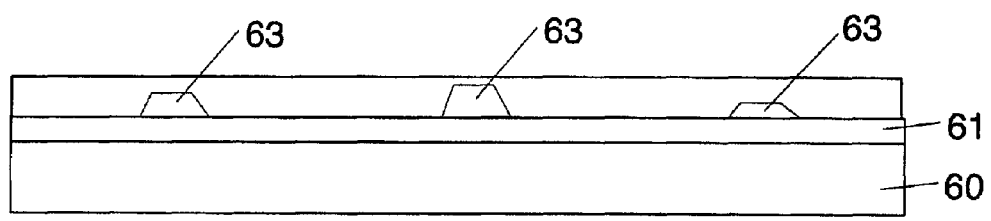

To produce HBTs 10 with either high BVceo or high $F_t$ on a single wafer 20, the thickness of the lightly doped collector region 62a, as shown in FIG. 20, over a selected portion of the device may be chosen through ion implantation to create a heavily doped (N+) region 63. The ion implantation of region 63 in the individual HBTs 10 may be performed by: 1) applying and forming an implant mask 75 to the collector layer 62 so as to expose only the portion of the collector layer 62 for one or more of the HBTs 10 with the same collector profile requirements, as shown in FIG. 23; 2) performing ion implantation until region 63 is formed, as shown in FIG. 24; 3) removing implant mask 75, as shown in FIG. 25; 4) repeating steps 1-3 for the remaining HBTs 10 with different collector profile requirements to be ion implanted with regions 63, as shown in FIG. 26; 5) finally annealing the structure in FIG. 26 for implant activation of and damage removal within N+ regions 63.

This disclosure is not limited to shape of implant regions 63 per individual HBTs as depicted in FIGS. 20 and 24-26. There could be single or multiple implants forming individual regions 63 per HBT depending on the requirement for the collector profile. The thickness and doping level of region 63 may be determined by the energy and dose of the ion implantation process.

The ion implantation of regions 63 may be performed by any ion implantation process, including by regular masked implant or by stencil mask ion implantation technology. See for example Takeshi Shibata et al, "Stencil mask Ion implantation technology", IEEE Transactions on semiconductor manufacturing, Vol, 15, No. 2, May 2002, pp. 183-188.

Figure 27:
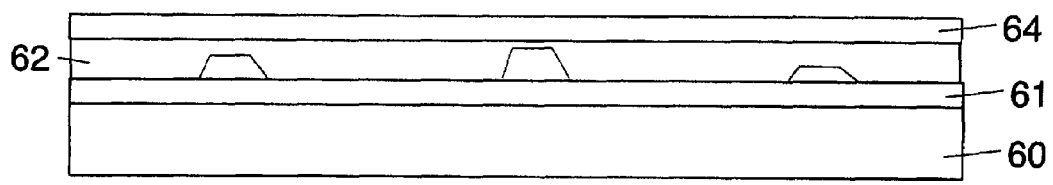

Upon completion of the ion implantation, base layer 64 may be formed, for example, by epitaxial growth on top of the collector layer 62, as shown in FIG. 27. The base layer 64 may consist, for example, of P-type GaAsSb (P+) material with carbon or beryllium doping or P-type InGaAs (P+) material with carbon or beryllium doping. As known in the art (U.S. Pat. Nos. 5,606,185 and 5,753,545), if InGaAs material is used for the base layer 64, a quaternary graded layer (not shown) or chirped super-lattice graded layer (not shown) may be inserted between InP collector layer 62 and InGaAs base layer 64. A quaternary graded layer or chirped super-lattice graded layer may be needed to maintain lattice match and continuously adjust the conduction band edge from the InP collector 62 to the InGaAs base layer 64. The quaternary graded layer may consist, for example, of $Ga_{1-x}In_xAs_{1-y}P_y$ or $Al_xGa_yIn_{1-(x+y)}As$ materials whereas the chirped super-lattice graded layer may consist of $Al_{0.48}In_{0.52}As$ and $Ga_{0.47}In_{0.53}As$ materials. The thickness of the layer 64 may, for example, be about 400 Å.

Figure 28:
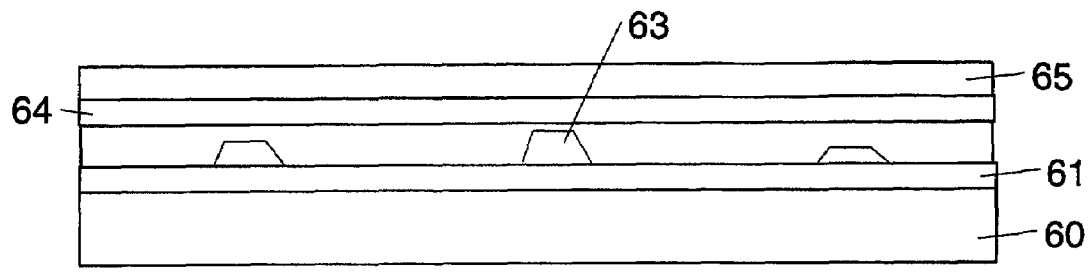

An emitter layer 65 may be formed, for example, by epitaxial growth on top of the base layer 64, as shown in FIG. 28. The emitter layer 65 may consist, for example, of N-type InP (N) material that is silicon doped or N-type InAlAs (N) material that is silicon doped. As known in the art, if base layer 64 material is beryllium doped, a quaternary graded layer (not shown) or chirped super-lattice graded layer (not shown) may be inserted between the base layer 64 and the emitter layer 65. A quaternary graded layer or chirped super-lattice graded layer may be needed to prevent beryllium diffusion out of beryllium doped base layer 64. The quaternary graded layer may consist, for example, of $Ga_{1-x}In_xAs_{1-y}P_y$ or $Al_xGa_yIn_{1-(x+y)}As$ materials, whereas the chirped super-lattice graded layer may consist of $Al_{0.48}In_{0.52}As$ and $Ga_{0.47}In_{0.53}As$ materials, for example. The thickness of the layer 65 may, for example, be about 1000 Å.

Figure 29:
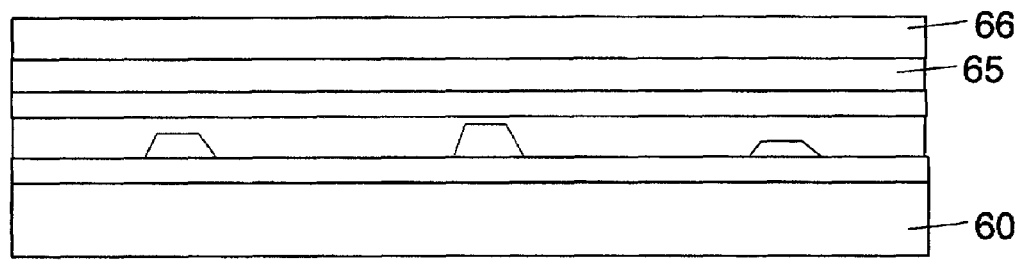

The emitter layer 65 may be followed by formation, for example, by epitaxial growth of emitter cap layer 66, as shown in FIG. 29. The emitter cap layer 66 may consist, for example, of N-type InGaAs (N+) material that is doped heavily with silicon. The thickness of the layer 66 may, for example, be about 1000 Å.

Figure 30:
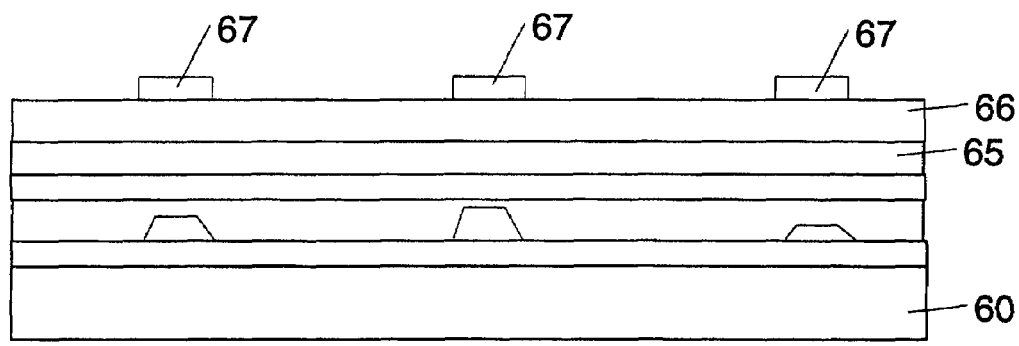
Figure 31:
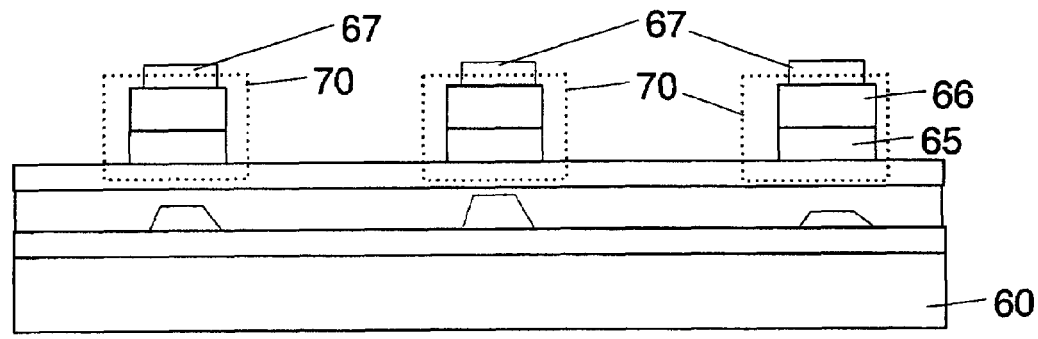
Figure 32:
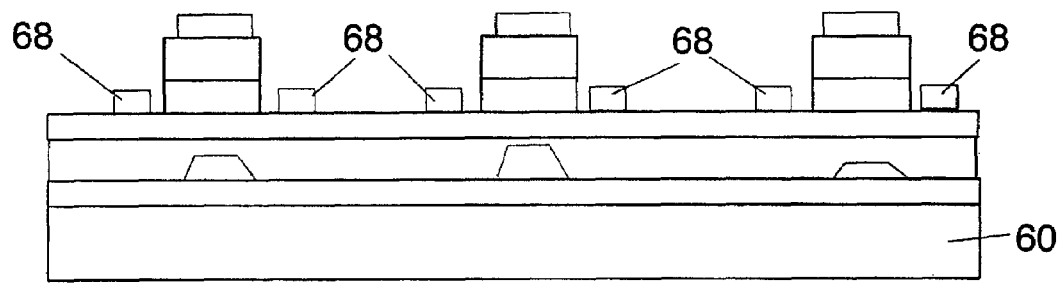
Figure 33:
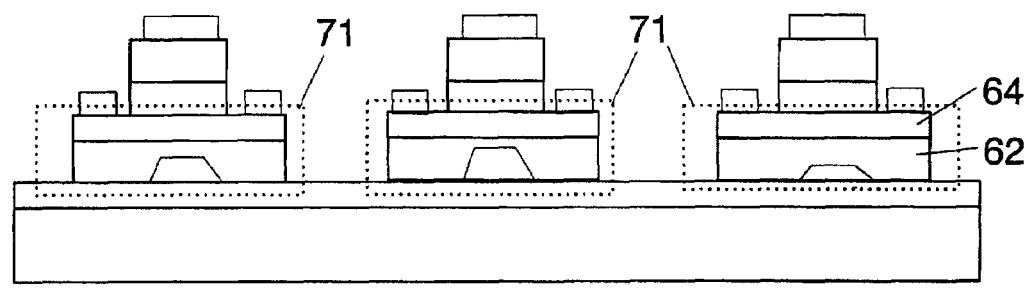
Figure 34:
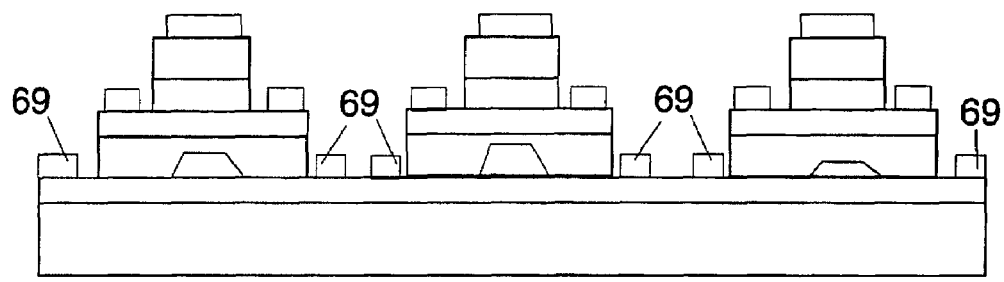
Figure 35:
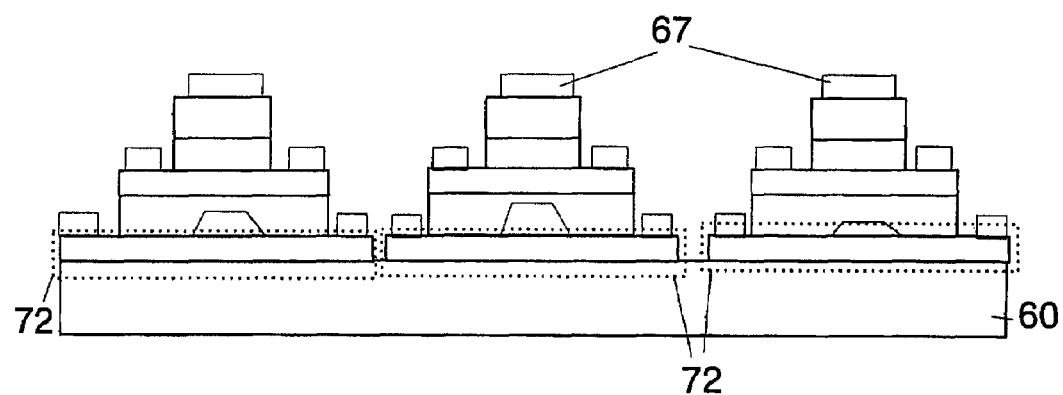

The process of HBTs fabrication may further include well know steps in the art of: providing emitter contacts 67 through lithography and metal deposition, as shown in FIG. 30; etching emitter mesas 70, as shown in FIG. 31; providing base contacts 68 through lithography and metal deposition, as shown in FIG. 32; etching base mesas 71, as shown in FIG. 33; providing collector contacts 69 through lithography and metal deposition, as shown in FIG. 34; and etching of collector/isolation mesas 72, as shown in FIG. 35.

The electrically conducting emitter contacts 67 may consist, for example, of Ti/Pt/Au. The electrically conducting base contacts 68 may consist, for example, of Ti/Pt/Au or Pt/Ti/Pt/Au. The electrically conducting collector contacts 69 may consist, for example, of Ti/Pt/Au or AuGe or AuGe/Ni/Au.

In another exemplary embodiment, HBTs 10, as shown in FIG. 20, could be grown having either a high BVceo or a high $F_t$ by varying ion implantation profile of region 63 in collector layer 62 on a Semi-Insulating GaAs wafer, as shown by FIGS. 20-35.

Individual HBTs 10 may be grown on the substrate layer 60 of a wafer 20, as shown by FIGS. 20-35, wherein the substrate layer 60 may be a Semi-Insulating GaAs wafer. The thickness of the substrate layer 60 may be about 0.5 mm. For clarity and example purposes, and not by way of limitation, FIGS. 21-35 depict only the process of forming three HBTs with different collector profiles.

A sub-collector layer 61 may be formed, for example, by epitaxial growth on top of the substrate layer 60, as shown in FIG. 21. The sub-collector layer 61 may consist, for example, of N-type GaAs (N+) material that is doped heavily with silicon. The thickness of the GaAs layer 61 may, for example, be about 3000 Å.

A collector layer 62 may be formed, for example, by epitaxial growth on top of the sub-collector layer 61, as shown in FIG. 22. The collector layer 62 may consist, for example, of N-type GaAs (N−) material that is doped lightly with silicon. The doping and thickness of the collector layer 62 may be determined by the HBT in the wafer 20 with the highest BVceo requirement. Collector layer 62 may be formed, for example, by epitaxial growth uniformly across layer 61, as shown in FIG. 22, to a maximum thickness that is required to yield the HBT with the highest BVceo requirement.

To produce HBTs 10 with either high BVceo or high $F_t$ on a single wafer 20, the thickness of the lightly doped collector region 62a over a selected portion of the device may be chosen through ion implantation to create a heavily doped (N+) region 63. The ion implantation of region 63 in the individual HBTs 10 may be performed by: 1) applying and forming an implant mask 75 to the collector layer 62 so as to expose only the portion of the collector layer 62 for one or more of the HBTs 10 with the same collector profile requirements, as shown in FIG. 23; 2) performing ion implantation until region 63 is formed, as shown in FIG. 24; 3) removing implant mask 75, as shown in FIG. 25; 4) repeating steps 1-3 for the remaining HBTs 10 with different collector profile requirements to be ion implanted with regions 63, as shown in FIG. 26; 5) finally annealing the structure in FIG. 26 for implant activation of and damage removal within N+ regions 63.

This disclosure is not limited to shape of implant regions 63 per individual HBTs as depicted in FIGS. 20 and 24-26. There could be single or multiple implants forming individual regions 63 per HBT depending on the requirement for collector profile. The thickness and doping level of region 63 may be determined by the energy and dose of the ion implantation process.

The ion implantation of regions 63 can be performed by any ion implantation process, including by regular masked implant or by stencil mask ion implantation technology. See for example Takeshi Shibata et al, "Stencil mask Ion implantation technology", IEEE Transactions on semiconductor manufacturing, Vol, 15, No. 2, May 2002, pp. 183-188.

Upon completion of the ion implantation, base layer 64 may be formed, for example, by epitaxial growth on top of the collector layer 62, as shown in FIG. 27. The base layer 64 may consist, for example, of P-type GaAs (P+) material with carbon or beryllium doping. The thickness of the layer 64 may, for example, be about 400 Å.

An emitter layer 65 may be formed, for example, by epitaxial growth on top of the base layer 64, as shown in FIG. 28. The emitter layer 65 may consist, for example, of N-type AlGaAs (N) material that is silicon doped or N-type InGaP (N) material that is silicon doped. The thickness of the layer 65 may, for example, be about 1000 Å.

The emitter layer 65 may be followed by formation, for example, by epitaxial growth of emitter cap layer 66, as shown in FIG. 29. The emitter cap layer 66 may consist, for example, of N-type InGaAs (N+) material that is heavily doped with silicon or N-type GaAs (N+) material that is heavily doped with silicon. The thickness of the layer 66 may, for example, be about 1000 Å.

The process of HBTs fabrication may further include well know steps in the art of: providing emitter contacts 67 through lithography and metal deposition, as shown in FIG. 30; etching emitter mesas 70, as shown in FIG. 31; providing base contacts 68 through lithography and metal deposition, as shown in FIG. 32; etching base mesas 71, as shown in FIG. 33; providing collector contacts 69 through lithography and metal deposition, as shown in FIG. 34; and etching of collector/isolation mesas 72, as shown in FIG. 35.

The electrically conducting emitter contacts 67 may consist, for example, of Ti/Pt/Au. The electrically conducting base contacts 68 may consist, for example, of Ti/Pt/Au or Pt/Ti/Pt/Au. The electrically conducting collector contacts 69 may consist, for example, of Ti/Pt/Au or AuGe or AuGe/Ni/Au.

The embodiments described in detail for exemplary purposes are, of course, subject to many different variations in structure, design and application. Since many varying and different embodiments may be made within the scope of the inventive concepts herein taught, and since many modifications may be made in the embodiment herein detailed in accordance with the descriptive requirements of the law, it is to be understood that the detailed embodiments provided above are to be interpreted as illustrative and not in a limiting sense.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "step(s) for . . . ."

What is claimed is:

1. A method of forming Heterojunction Bipolar Transistors (HBTs) on a wafer, said method comprising:
   providing a group III-V compound semiconductor based substrate;
   forming of HBT layers up to and including a collector layer on said substrate;
   forming at least a first lightly doped collector region in said collector layer for a least one high $F_t$ HBT;
   forming at least a second lightly doped collector region in said collector layer for a least one high breakdown voltage (BVceo) HBT, wherein a thickness of the first lightly doped collector region for the high $F_t$ HBT is less that a thickness of the second lightly doped collector region for the high breakdown voltage (BVceo) HBT;
   implanting first ions through said first lightly doped collector region to form a first implant region in said collector layer;
   implanting second ions through said second lightly doped collector region to form a second implant region in said collector layer; and
   annealing said wafer.

2. The method of claim 1 wherein implanting first ions comprises:
   a) applying an implant mask to said collector layer so as to expose only a portion of said collector layer for one or more HBTs with substantially similar collector profile requirements;
   b) implanting one or more first regions in said collector layer; and
   c) repeating steps a-b for HBTs, if any, with different collector profile requirements.

3. The method of claim 1 wherein said substrate contains InP or GaAs.

4. The method of claim 1 wherein forming of HBT layers comprises: forming a first sub-collector layer on said substrate; and forming said collector layer on said sub-collector layer.

5. The method of claim 4 further comprising: forming a second sub-collector layer between said substrate and said first sub-collector layer.

6. The method of claim 5 wherein said second sub-collector layer contains InP (N+).

7. The method of claim 4 further comprising: forming a third sub-collector layer between said collector layer and said sub-collector layer.

8. The method of claim 7 wherein said third sub-collector layer contains InP (N+).

9. The method of claim 4 wherein said first sub-collector layer contains InGaAs (N+) or GaAs (N+).

10. The method of claim 4 wherein said collector layer contains InP (N−) or GaAs (N).

11. The method of claim 1 wherein said base layer contains GaAsSb (P+), InGaAs (P+) or GaAs (P+).

12. The method of claim 1 wherein said emitter layer contains InP (N), InAlAs (N), AlGaAs (N) or InGaP (N).

13. The method of claim 1 wherein said emitter cap layer contains InGaAs (N+) or GaAs (N+).

14. The method of claim 1 wherein implanting second ions comprises:

a) applying an implant mask to said collector layer so as to expose only a portion of said collector layer for one or more HBTs with substantially similar collector profile requirements;
b) implanting one or more first regions in said collector layer; and
c) repeating steps a-b for HBTs, if any, with different collector profile requirements.

15. The method of claim 1:
wherein the thickness and doping level of the first implant region is determined by the energy and dose of the first ion implantation; and
wherein the thickness and doping level of the second implant region is determined by the energy and dose of the second ion implantation.

16. The method of claim 1 wherein forming the collector layer comprises forming the collector layer by epitaxial growth to a maximum thickness required for an HBT with a highest desired BVceo requirement.

17. The method of claim 1 wherein forming the collector layer comprises forming the collector layer with a uniform epitaxial growth.

18. The method of claim 1 wherein the first implant region varies in depth and shape from said second implant region.

19. The method of claim 1 wherein:
the first implant region is below the first lightly doped collector region; and
the second implant region is below the second lightly doped collector region.

20. The method of claim 1 further comprising:
forming a base layer on said collector layer;
forming an emitter layer on said base layer;
forming an emitter cap layer on said emitter layer;
providing an electrically conducting emitter contact;
providing electrically conducting base contacts; and
providing electrically conducting collector contacts.

* * * * *